United States Patent
Stoner et al.

(10) Patent No.: US 7,204,699 B2
(45) Date of Patent: Apr. 17, 2007

(54) ELECTRICAL CONNECTOR WITH PROVISIONS TO REDUCE THERMALLY-INDUCED STRESSES

(75) Inventors: Stuart C. Stoner, Lewisberry, PA (US); Christopher G. Daily, Harrisburg, PA (US); John D. Dodds, Round Rock, TX (US); Wilfred James Swain, Mechanicsburg, PA (US); Christopher J. Kolivoski, York, PA (US); Douglas M. Johnescu, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/022,748

(22) Filed: Dec. 27, 2004

(65) Prior Publication Data

US 2006/0141819 A1    Jun. 29, 2006

(51) Int. Cl.
*H01R 12/00* (2006.01)
(52) U.S. Cl. .......................... 439/71; 439/83
(58) Field of Classification Search ............... 439/71, 439/108, 684, 688, 701, 74, 101, 70, 76.1, 439/79, 650–654, 66, 83; 324/754–755, 324/777, 758, 765, 761
See application file for complete search history.

(56) References Cited

U.S. PATENT DOCUMENTS

| 5,702,255 | A | 12/1997 | Murphy et al. ............... 439/71 |
|---|---|---|---|
| 6,018,249 | A * | 1/2000 | Akram et al. ............... 324/758 |
| 6,139,336 | A | 10/2000 | Olson ........................... 439/83 |
| 6,203,331 | B1 | 3/2001 | McHugh et al. .............. 439/71 |
| 6,354,850 | B1 | 3/2002 | Harper, Jr. et al. ........... 439/83 |
| 6,471,526 | B1 | 10/2002 | Harper, Jr. ................... 439/83 |
| 6,529,022 | B2 * | 3/2003 | Pierce ........................ 324/754 |
| 6,537,087 | B2 * | 3/2003 | McNamara et al. ........ 439/108 |
| 6,638,079 | B1 * | 10/2003 | Billman et al. ............ 439/76.1 |
| 6,859,056 | B2 * | 2/2005 | Bai et al. .................... 324/755 |
| 2002/0063318 | A1 | 5/2002 | Mitchell et al. ............ 257/678 |
| 2006/0057897 | A1 | 3/2006 | Minich et al. .............. 439/701 |

* cited by examiner

*Primary Examiner*—Truc T. Nguyen
*Assistant Examiner*—Edwin A. Leon
(74) *Attorney, Agent, or Firm*—Woodcock Washburn LLP (57) ABSTRACT

A preferred embodiment of an electrical connector includes a housing, a wafer positioned adjacent the housing and being movable in relation to the housing, a first contact extending through the housing, a first fusible element mounted on an end of the first contact for securing the first contact to the housing and to a first location on a substrate, a second contact extending through the housing and the wafer and being movable in relation to the housing, and a second fusible element mounted on an end of the second contact for securing the second contact to a second location on the substrate so that the second contact can deflect substantially independent of the housing and the first contact in response to relative movement between the housing and the second location on the substrate.

15 Claims, 12 Drawing Sheets

ELECTRICAL CONNECTOR WITH PROVISIONS TO REDUCE THERMALLY-INDUCED STRESSES

FIELD OF THE INVENTION

The present invention relates to electrical connectors of the type that are mounted on a substrate using multiple solder connections.

BACKGROUND OF THE INVENTION

Electrical connectors, such as ball-grid array (BGA) connectors, are commonly mounted on a substrate using multiple solder connections. The solder connections act as electrical and mechanical connections between the substrate and the connector.

The connector and substrate typically operate at temperatures above ambient. Temperature changes can cause the connector and substrate to deflect, i.e., to expand or contract. (The amount of deflection of a component as a function of temperature change often is expressed as the coefficient of thermal expansion (CTE) for the component.) The amount of deflection experienced by the connector and substrate in response to a given temperature change usually differs. In other words, the CTEs of the connector and the substrate are usually different.

Differences between the amount of thermally-induced deflection of the connector and the substrate can induce stresses on the solder connections between the two components. These stresses, repeated over multiple heating and cooling cycles (referred to as "thermal cycling") can weaken the solder connections. Weakening of a solder connection can affect the integrity of the signal transmission through the solder connection, and in extreme cases can result in separation of the solder connection from the connector or the substrate.

Positive temperature changes typically cause connectors to expand outward from the center thereof. Hence, the greatest amount of deflection in a square or rectangular connector occurs at and near its outer corners. Moreover, it is believed that the greatest differences between the respective deflections of the connector and the underlying substrate occur at and near the outer corners of the connector. The solder connections associated with these locations therefore are subject to relatively high thermally-induced stresses.

SUMMARY OF THE INVENTION

A preferred embodiment of an electrical connector capable of being mounted on a substrate comprises a wafer, and a housing for receiving the wafer. The wafer is movable in relation to the housing, and can be positioned in a depression defined on a mating side of the housing. One general feature of the present invention is to isolate certain areas for movement that is independent of the rest of the housing.

The electrical connector also comprises a first plurality of contacts extending through the housing, and a first plurality of fusible elements mounted on respective ends of the first plurality of contacts for securing the first plurality of contacts to the housing and the substrate. The electrical connector further comprises a second plurality of contacts, and a second plurality of fusible elements mounted on respective ends of the second plurality of contacts for securing the second plurality of contacts to the substrate. The second plurality of contacts can move with respect to the housing.

A preferred embodiment of an electrical connector comprises a housing, a wafer slidably engaging the housing, a contact extending through the housing and the wafer; and a fusible element mounted on an end of the contact so that the wafer is positioned between the fusible element and the housing.

A preferred embodiment of a system comprises a substrate and an electrical connector. The connector comprises a housing, and a wafer being movable in relation to the housing. The connector also comprises a first contact extending through the housing and being secured to the housing and the substrate by a first solder connection, and a second contact extending through the housing and the wafer.

Another preferred embodiment of an electrical connector capable of being mounted on a substrate comprises a housing, a wafer positioned adjacent the housing and being movable in relation to the housing, and a first contact extending through the housing. The connector also comprises a first fusible element mounted on an end of the first contact for securing the first contact to the housing and to a first location on the substrate, and a second contact extending through the housing and the wafer and being movable in relation to the housing.

The connector further comprises a second fusible element mounted on an end of the second contact for securing the second contact to a second location on the substrate so that the second contact can deflect substantially independent of the housing and the first contact in response to relative movement between the housing and the second location on the substrate.

Another preferred embodiment of an electrical connector comprises a housing, a contact extending through the housing, and a wafer being movable in relation to the housing. The wafer engages the contact so that the wafer mechanically isolates fusible element with respect to the housing. The connector also comprises a fusible element mounted on an end of the contact.

A preferred embodiment of an electrical connector capable of being mounted on a substrate comprises a housing having an elongated pocket formed therein, a contact mounted on the housing so that an end of the contact is positioned in the pocket, and a fusible element attached to the end of contact for forming an electrical connection between the contact and the substrate.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF PREFERRED EMBODIMENTS

FIGS. 1–9 depict a preferred embodiment of an electrical connector 10. The figures are each referenced to a common coordinate system 11 depicted therein. The connector 10 is a socket for a BGA connector. This particular type of connector is disclosed for exemplary purposes only, as the principles of the present invention can be applied to other types of connectors.

Figure 9:
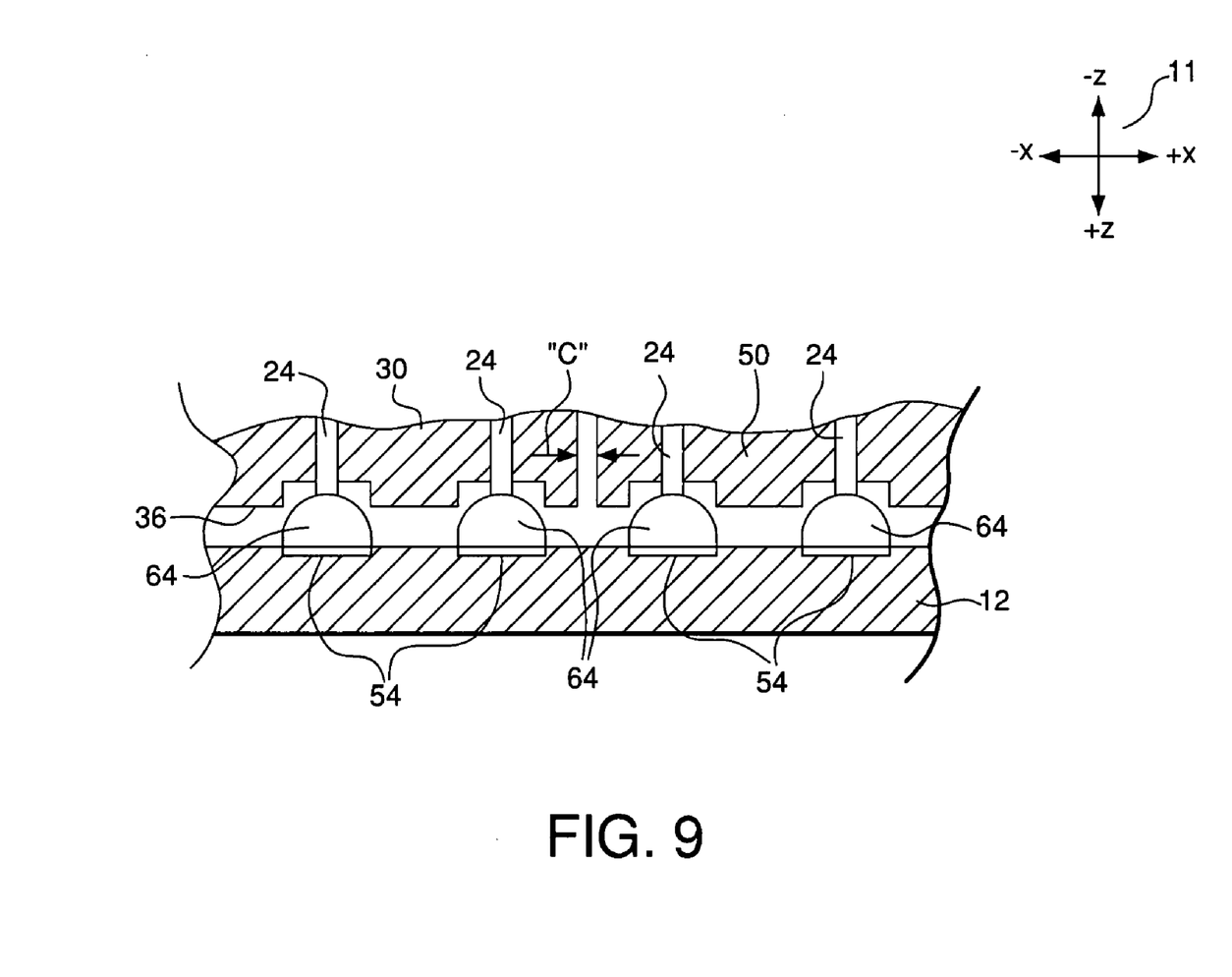
FIG. 9 is a magnified view of the area designated "E" in FIG. 6, depicting the connector mounted on a substrate.

The connector 10 can be mounted on a substrate 12 (see FIG. 9). The substrate 12 can be, for example, a printed circuit board, a printed wire board, a backplane, etc.

The connector 10 comprises a housing 14. The housing 14 is formed from a suitable electrically-insulative material such as plastic.

The connector 10 also comprises a plurality of contacts 18a, 18b mounted on the housing 14. (The contacts 18a are substantially identical to the contacts 18b; different reference symbols are used to denote differences between the respective positions of the contacts 18a, 18b within the housing 14, as discussed below.)

The contacts 18a, 18b each include a contact portion 20, and an elongated body 22 that adjoins a first end of the contact portion 20. Each contact 18 also includes a substantially S-shaped tail 24 that adjoins a second end of the body 22 (see FIG. 6).

The housing 14 comprises a bottom portion 30 having an upper surface 32 and a lower surface 36. The housing 14 also includes a plurality of ribs 33 that project from the upper surface 32, and a plurality of partitions 35 positioned between adjacent ones of the ribs 33 (see FIGS. 6, 7A, and 7B). Opposing pairs of the ribs 33 and the associated partitions 35 define cavities 37 within the housing 14.

Figure 6:
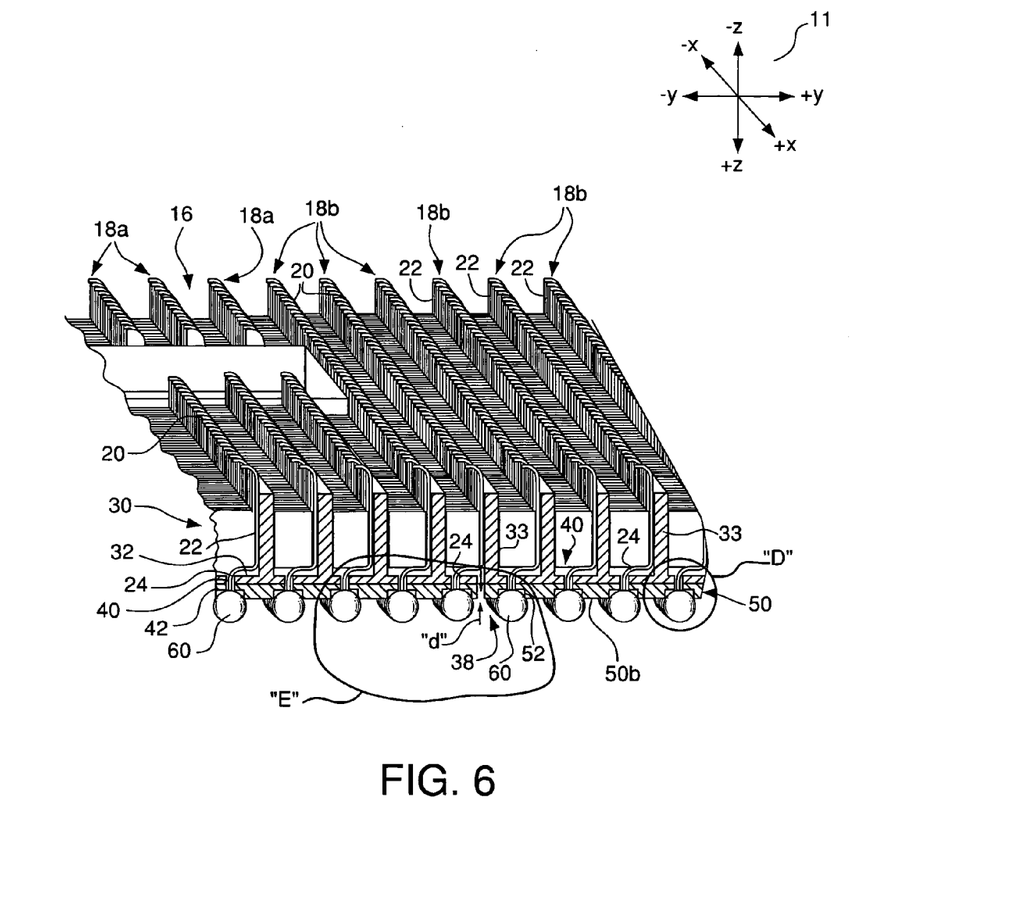
FIG. 6 is a magnified view of the area designated "F" in FIG. 5B.

(Directional terms such as top, bottom, upper, lower, etc., are used in reference to the component orientations depicted in FIG. 6; these terms are used for exemplary purposes only, and are not intended to limit the scope of the appended claims.)

Figure 7A:
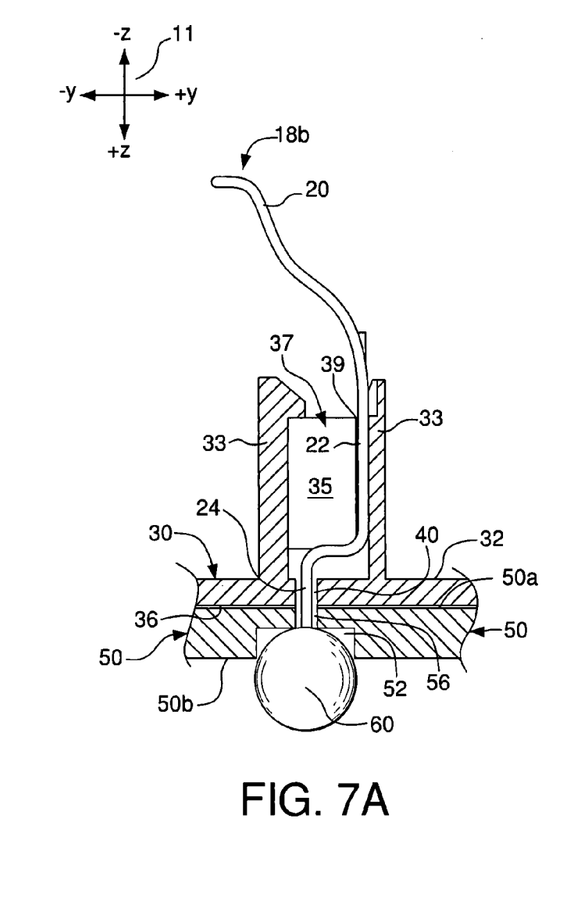
FIG. 7A is a magnified view of the area designated "D" in FIG. 6.

The partitions 35 have slots 39 formed therein (see FIG. 7A). Each slot 39 extends substantially in the vertical ("z") direction, and is defined by two beveled surfaces 41 of the partition 35 (see FIG. 7B). Each slot 39 receives an outer edge of the body 22 of an associated contact 18a, 18b.

Figure 1:
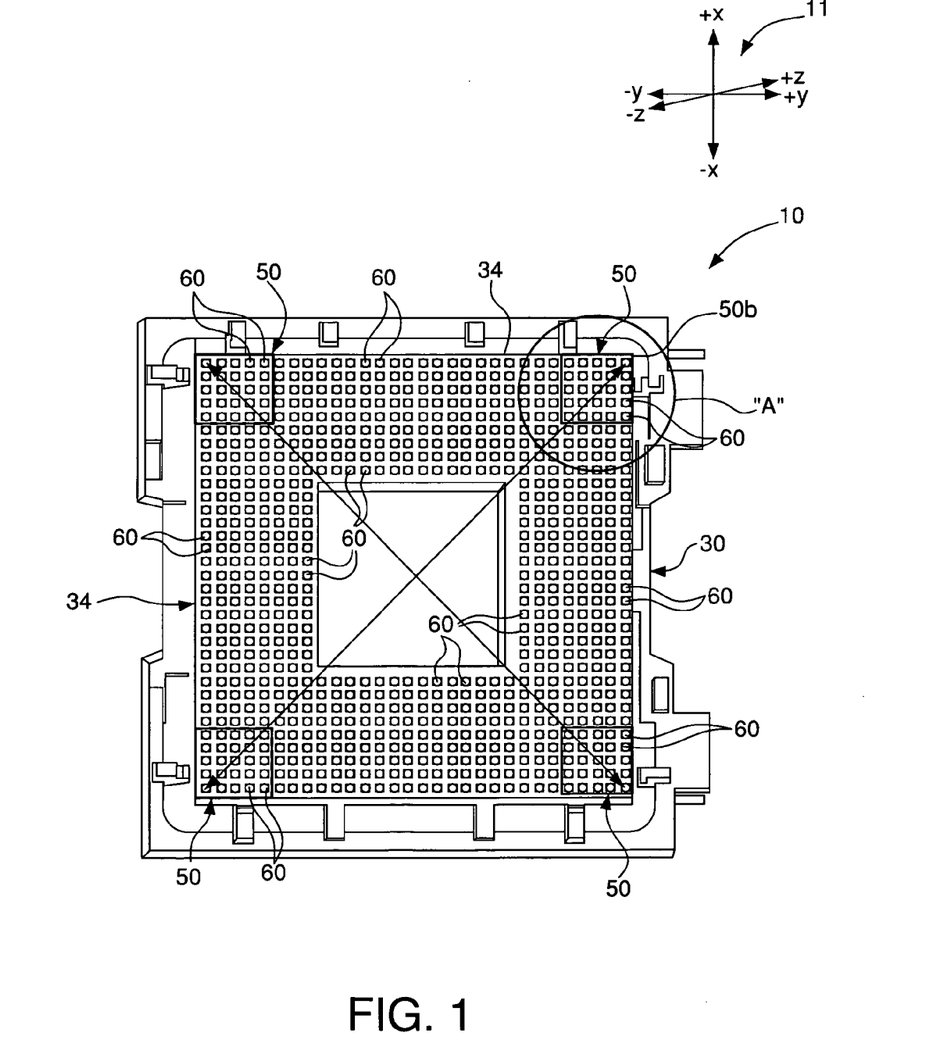
FIG. 1 is a bottom view of a preferred embodiment of an electrical connector.
Figure 2:
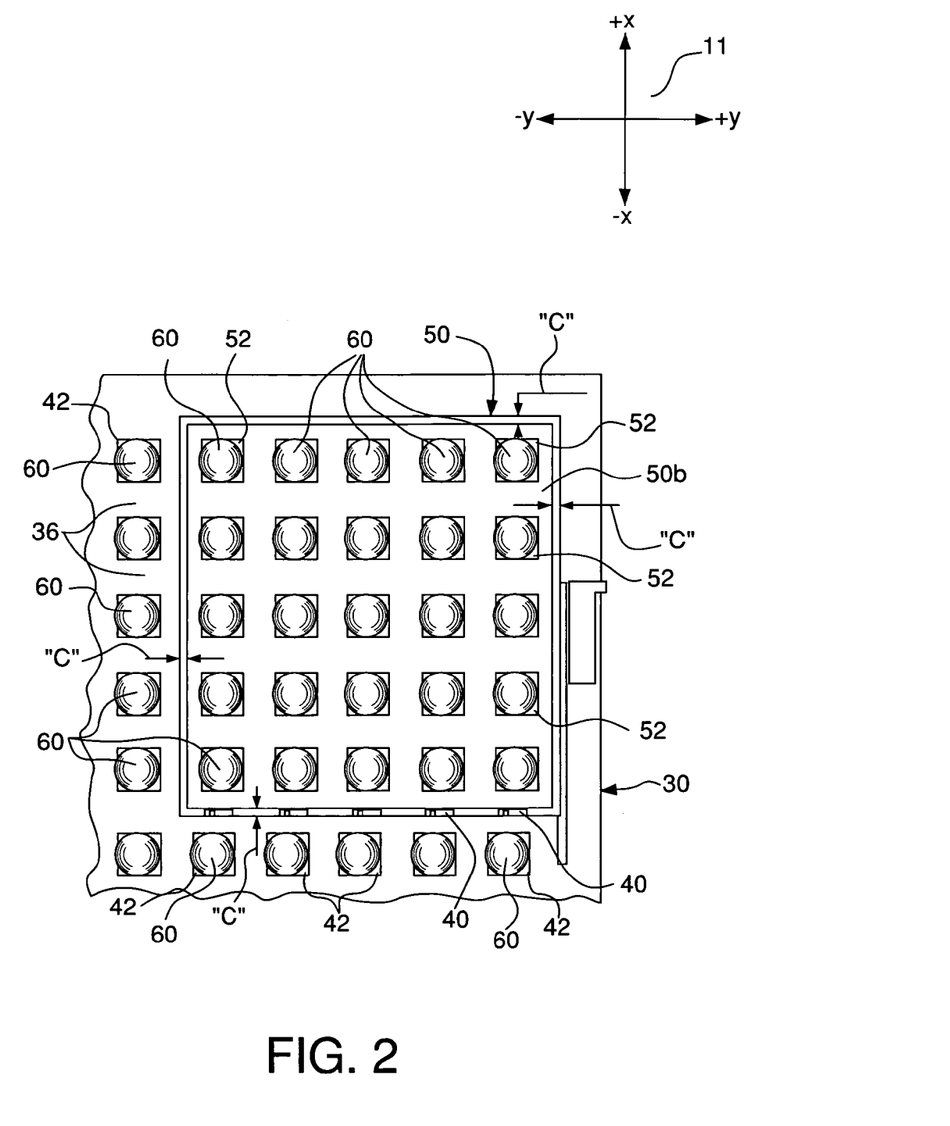
FIG. 2 is a magnified view of the area designated "A" in FIG. 1.
Figure 3:
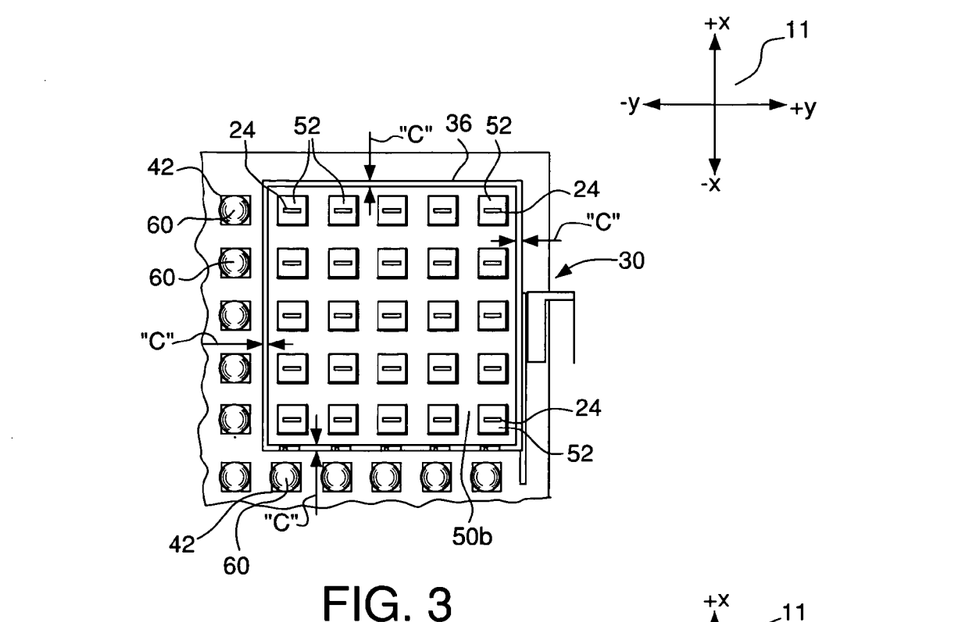
FIG. 3 is a magnified view of the area designated "A" in FIG. 1, with solder balls of the connector removed.
Figure 4:
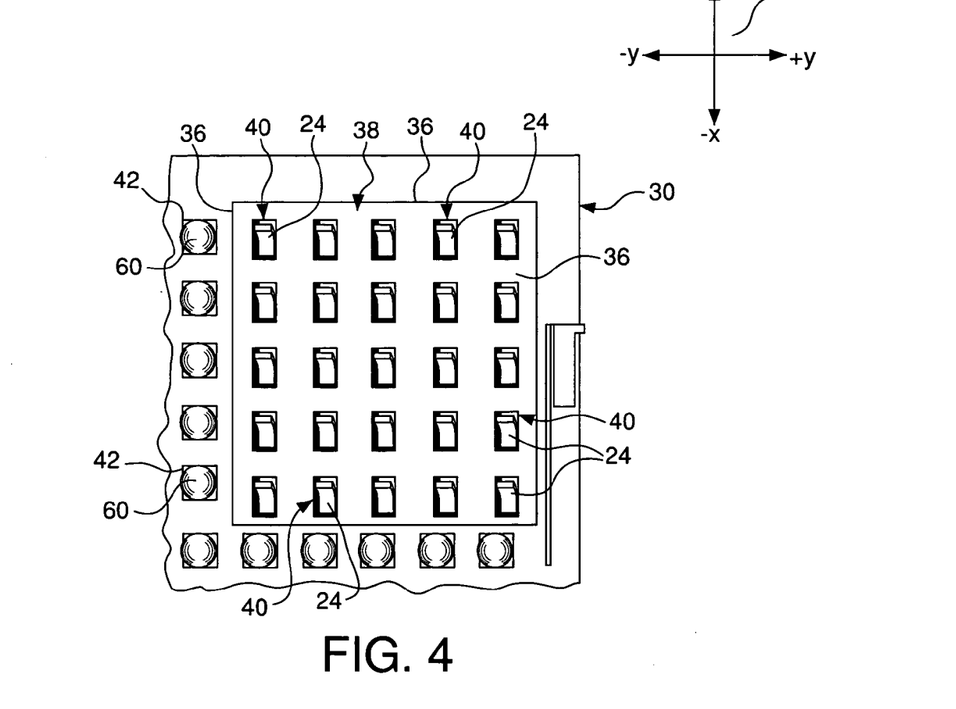
FIG. 4 is a magnified view of the area designated "A" in FIG. 1, with a wafer of the connector removed.
Figure 5A:
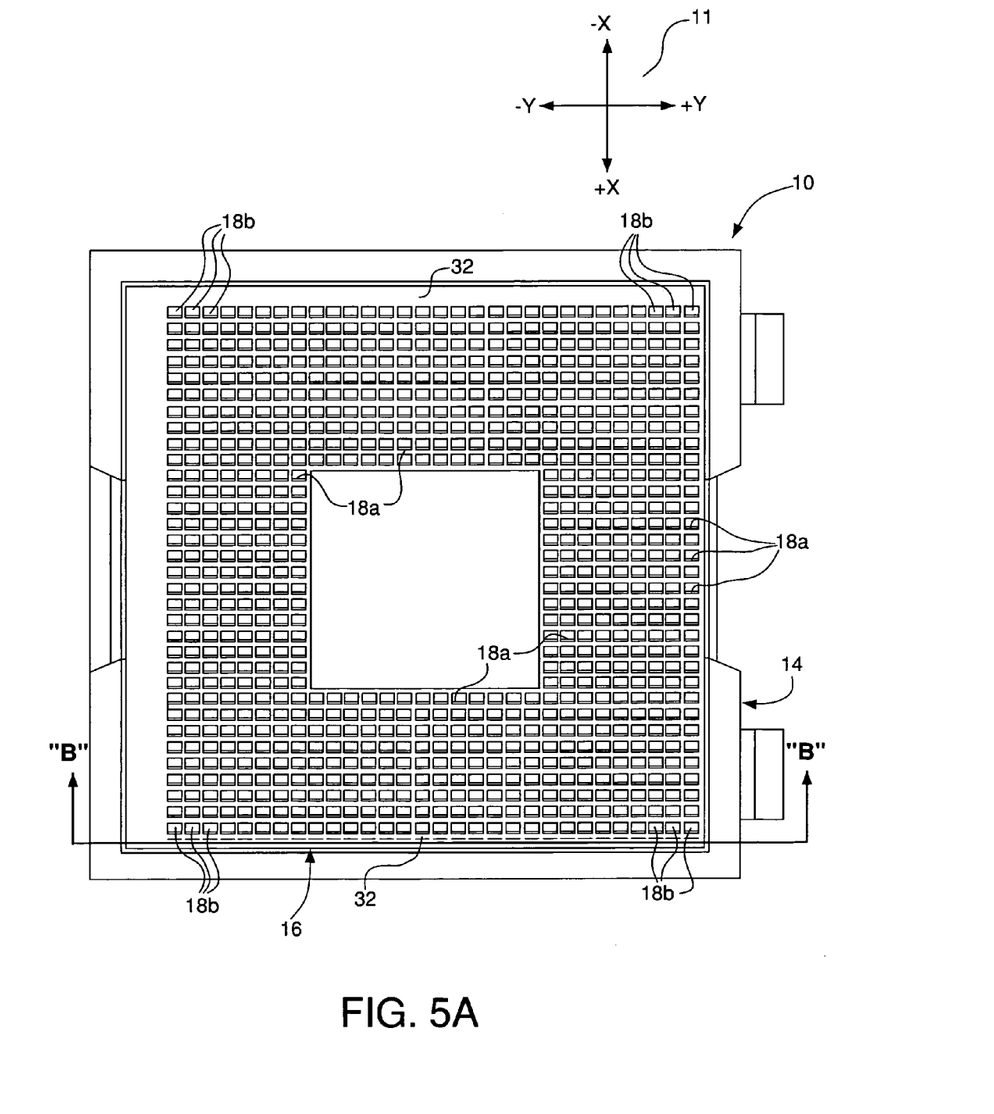
FIG. 5A is a top view of the electrical connector shown in FIGS. 1–4.
Figure 5B:
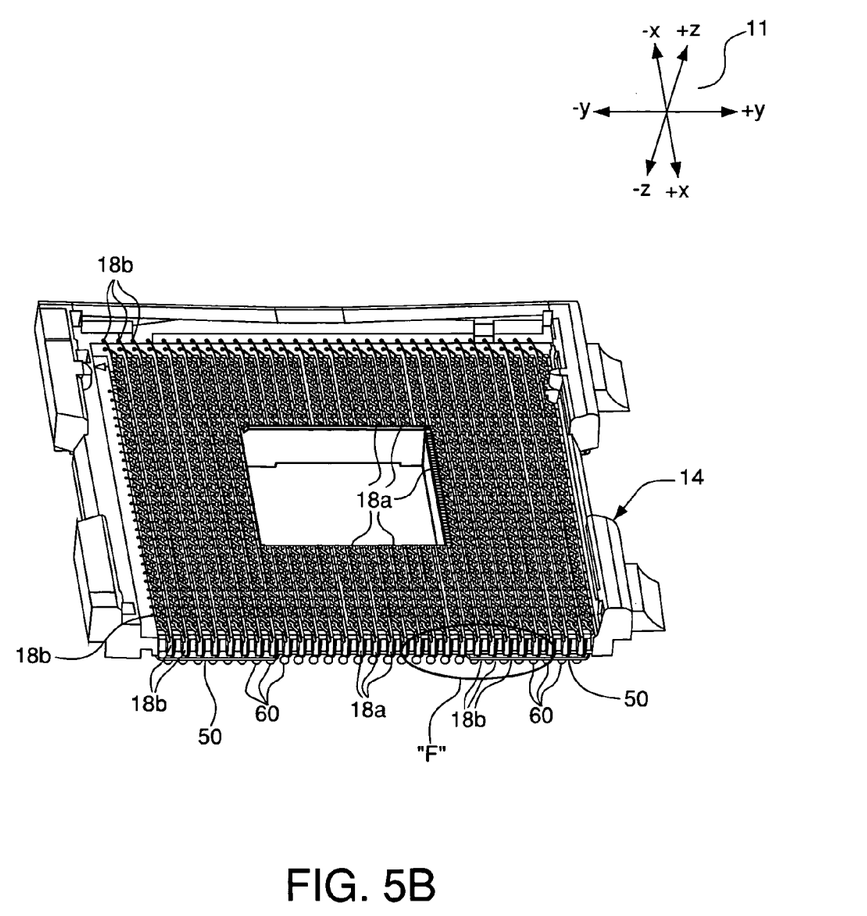
FIG. 5B is a top perspective view of the electrical connector shown in FIGS. 1–5A, taken through the line "B—B" of FIG. 5A.

Four depressions 38 are formed in the lower surface 36 of the housing 14 (see FIG. 4 and 6). Each depression 38 is located proximate an outer corner of the lower surface 36. (The contacts 18b are associated only with the portions of the bottom portion 30 having the depressions 38 formed therein, as discussed below.)

The bottom portion 30 of the housing 14 has a plurality of penetrations 40 formed therein (see FIGS. 4, 6, 7A, and 7B). Each penetration 40 receives a portion of a corresponding one of the tails 24. Each penetration 40 originates on the upper surface 32 of the bottom portion 30, and adjoins a corresponding one of the cavities 37. The penetrations 40 are sized so that a clearance can exist between the periphery of the penetrations 40, and the portions of the tails 24 located therein. For example, the penetrations 40 can be sized so that a clearance of approximately 0.1 mm exists between the periphery thereof and the tails 24. It should be noted that the optimal value for the clearance is application-dependent, and a particular value is specified for exemplary purposes only.

The cavities 37 receive the contacts 18a, 18b. In particular, the body 22 of each contact 18a, 18b is positioned substantially within a corresponding one the cavities 37 so that the adjoining tail 24 extends through the associated penetration 40, and the contact portion 20 extends upward from the cavity 37 (see FIGS. 5A–8). The slots 39 associated with each cavity 37 receive opposing outer edges of the body 22. The beveled surfaces 41 that define each slot 39 contact an outer edge of the body 22, and help to restrain the associated contact 18a, 18b within the housing 14.

The penetrations 40 associated with the contacts 18b each adjoin a corresponding one of the depressions 38 (see FIGS. 4 and 6). A portion of the tail 24 of each of the contacts 18b extends from the corresponding penetration 40 and into a corresponding one of the depressions 38.

A plurality of pockets 42 are formed in the bottom portion 30 (see FIGS. 1–4). The pockets 42 are associated only with the contacts 18a. Hence, the pockets 42 are not formed in the portions of the bottom portion 30 associated with the depressions 38. Each pocket 42 extends inward from the lower surface 36 of the bottom portion 30, and adjoins a corresponding penetration 40. A portion of the tail 24 of each contact 18a extends from the corresponding penetration 40 and into a corresponding one of the pockets 42.

The connector 10 also comprises four wafers 50 (see FIGS. 1–3 and 6–8). Each wafer 50 is positioned within a corresponding one of the depressions 38 when the connector 10 is mounted on the substrate 12. The wafers 50, as discussed below, facilitate relative movement between the contacts 18b and the housing 14. The wafers 50 are formed from a suitable electrically-insulative material, and preferably are formed from a liquid crystal polymer. Optimally, the material from which the wafers 50 are formed should have a CTE approximately equal to that of the material from which the housing 14 is formed, and the CTEs of both materials should remain approximately constant within the projected range of operating temperatures for the connector 10.

Each wafer 50 has an upper surface 50a, and a lower surface 50b. The upper surface 50a preferably abuts the lower surface 36 of the housing 14 when the wafer 50 is positioned in the associated depression 38 (see FIGS. 7A and 7B). A plurality of pockets 52 are formed in each wafer 50 (see FIGS. 3, 7A, 7B, and 8). The pockets 52 extend inward (into the wafer 50) from the lower surface 50b. Twenty-five of the pockets 52, arranged in a five-by-five array, are formed in each of the wafers 50. (The optimal number and arrangement of the pockets 52 is application dependent. A specific number and arrangement of the pockets 52 is specified for exemplary purposes only.)

Figure 7B:
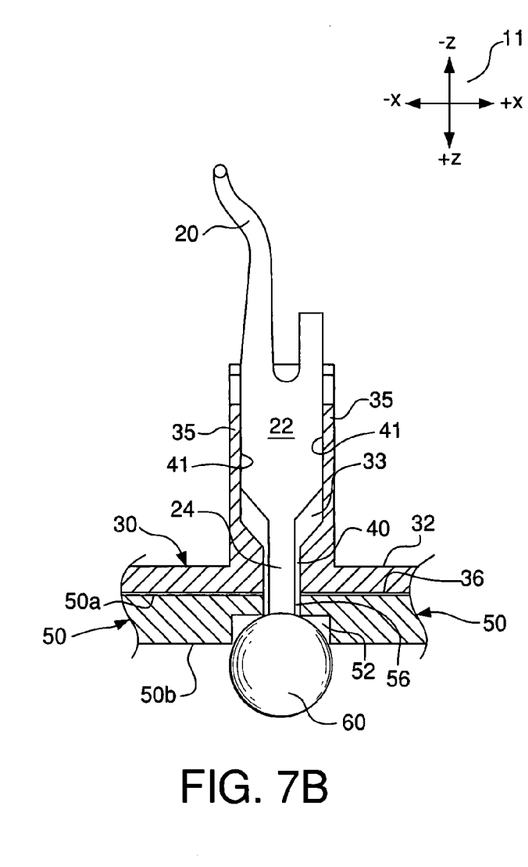
FIG. 7B is a view of the area "D" shown in FIG. 7A, from a perspective displaced ninety degrees from the perspective of FIG. 7A.
Figure 8:
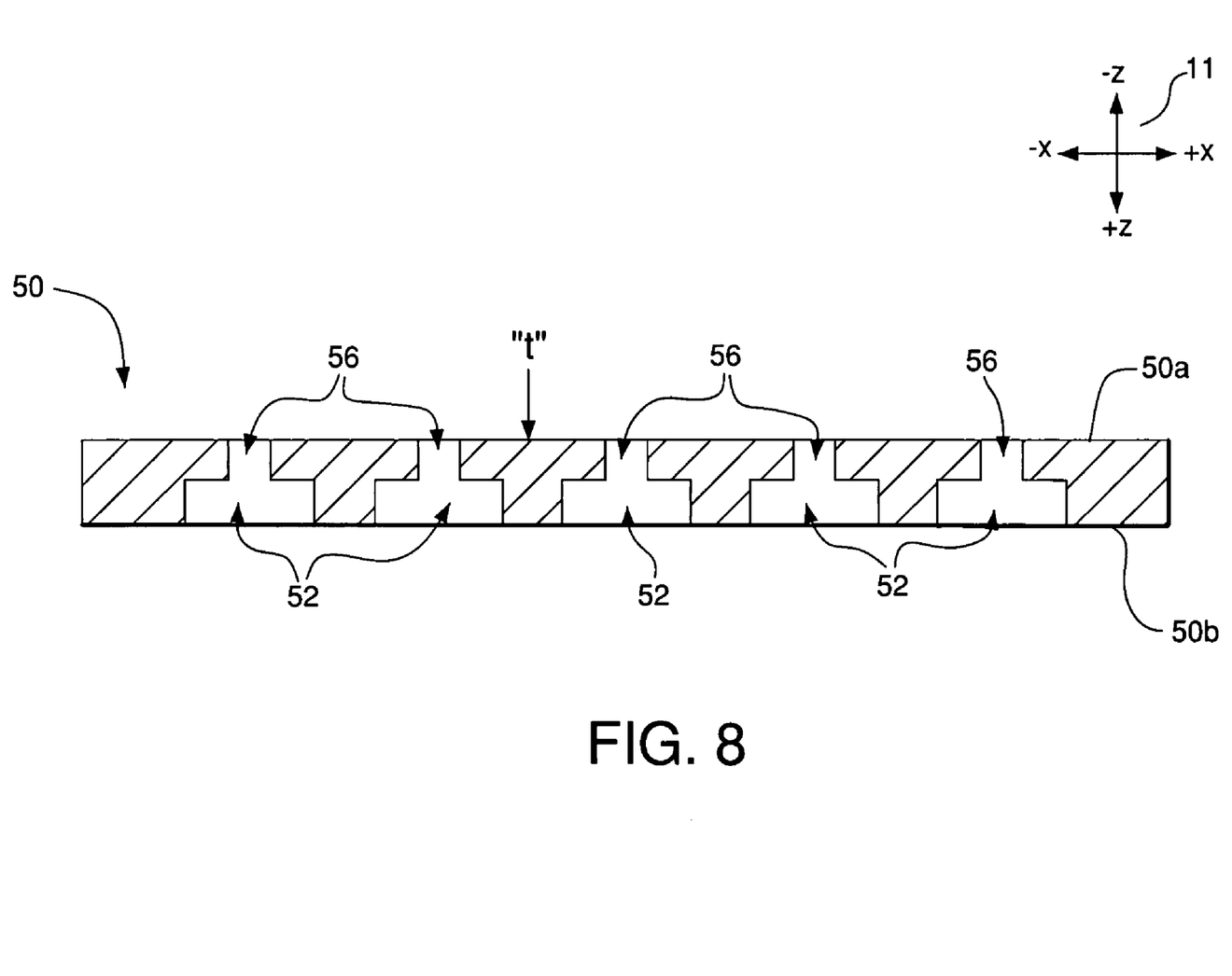
FIG. 8 is a cross-sectional side view of a wafer of the connector shown in FIGS. 1–7B.

A slot 56 is formed in each wafer 50 (see FIGS. 7A, 7B, and 8). Each slot 56 extends inward from the upper surface 50a, and adjoins a corresponding one of the pockets 52. The tails 24 of the contacts 18b each extend through a corresponding one of the slots 56. Each slot 56 preferably is sized so that the corresponding tail 24 fits within the slot 56 with no substantial clearance between the tail 24 and the periphery of the slot 56.

The thickness of each wafer 50 is approximately equal to the depth of the depressions 38. (The thickness of the wafers 50 and the depth of the depressions 38 are denoted by the respective reference symbols "t" and "d" in FIGS. 6 and 8.) The depth of each depression 38 is approximately 0.3 mm. (The optimal value for the depth of the depressions 38 is application dependent; a particular value is specified herein for exemplary purposes only.)

The wafers 50 are sized so that a clearance can exist between the periphery of each wafer 50 and the periphery of the associated depression 38. The clearance is denoted by the reference symbol "c" in FIGS. 2, 3, and 9.

The wafers 50 are not necessarily physically connected to the housing 14. The wafers 50 are capable of a limited degree of lateral movement in relation to the housing 14. (The term "lateral movement," as used throughout the specification, denotes moment in the +x, −x, +y, and −y directions.) In particular, the upper surface 50a of each wafer 50 can slide over the adjacent portion of the lower surface 36 of the housing 14, within the confines of the corresponding depression 38.

The clearance "c" is approximately 0.14 mm in the connector 10. Hence, the wafers 50 can move approximately 0.14 mm from the positions depicted in FIG. 2, in each of the +x, −x, +y, and −y directions. This figure corresponds to the maximum anticipated difference between the thermally-induced deflections of the substrate 12 and the housing 14 at the outer corners of the housing 14. It should be noted that the optimal value for the clearance "c" is application dependent; a specific value is specified herein for exemplary purposes only.

The connector 10 further comprises a plurality of fusible elements in the form of solder balls 60. Each solder ball 60 is associated with a corresponding one of the contacts 18a, 18b. The solder balls 60 associated with the contacts 18a are positioned, in part, within a corresponding one of the pockets 42 of the housing 14 (see FIGS. 2–4 and 6). The solder balls 60 associated with the contacts 18b are positioned, in part, within a corresponding one of the pockets 52 of the wafers 50 (see FIGS. 2, 6, 7A, and 7B). Each solder ball 60 is mounted on the tail 24 of the corresponding contact 18a, 18b.

The solder balls 60 are used to electrically and mechanically connect the connector 10 to the substrate 12. In particular, each solder ball 60 aligns with a corresponding contact pad 54 on the substrate 12 when the connector 10 is placed thereon (see FIG. 9). The solder balls 60 are subjected to a reflow process that melts the solder balls 60. The melting and subsequent re-hardening of the solder forms solder connections 64 between the tails 24 of the contacts 18a, 18b and the corresponding contact pads 52. The wafers 50 can be held in position in relation to the housing 14 as the connector 10 is mounted on the substrate 12 using tabs (not shown) or other suitable means. The tabs can be broken after the connector has been mounted, to permit the wafers 50 to move in relation to the housing 14.

The solder connections 64 associated with the contacts 18a form a mechanical connection between the tails 24 of the contacts 18a, the housing 14, and the corresponding contact pads 52. Hence, the solder connections 64 associated with the contact 18a can be subject to stresses induced by differences between the thermal expansion of the substrate 12 and the housing 14.

The solder connections 64 associated with the contacts 18b form a mechanical connection between the tails 24 of the contacts 18b, and the associated contact pads 52. The tails 24 of the contacts 18b fit within the corresponding slots 56 of the wafers 50 with no substantial clearance between the tail 24 and the periphery of the slot 56, as noted above. Hence, the wafers 50 can act as barriers that prevent substantial amounts of solder associated with the contacts 18b from reaching and adhering to the housing 14. The housing 14 therefore remains unconnected to the wafers 50, and to the corresponding contacts 18b, solder connections 64, and contact pads 52.

The above-noted arrangement permits the wafers 50 and the contacts 18b to move laterally, independent of the housing 14 (and the contacts 18a), in response to thermally-induced deflection of the substrate 12. The above-noted clearance between the periphery of the penetrations 40 and the tails 24 of the contacts 18b facilitates relative movement between the contacts 18b and the housing 14. The degree of relative movement between the housing 14, and the wafers 50 and contacts 18b is limited by the clearance "c" between the wafers 50 and the edges of the corresponding depressions 38.

The configuration of the connector 10 permits the wafers 50 and the contacts 18b to move in relation to the adjacent portion of the housing 14 as the substrate 12 deflects at one rate, and the housing 14 deflects at another rate. Hence, the associated solder pads 62, solder connections 64, and tails 24 of the contacts 18b are not subject to stresses induced by differences between the thermally-induced deflection of the substrate 12 and the housing 14. These differences, it is believed, are maximal at or near the outer corners of the housing 14. Hence, placing the wafers 50 at the outer corners is believed to provide the maximum beneficial effect.

The configuration of the connector 10, it is believed, can help to reduce or eliminate stresses on the solder connections 64 induced by differences between the thermal expansion of the substrate 12 and the housing 14. The configuration of the connector 10 therefore can help to preserve the integrity, and prolong the life of the connections between the connector 10 and the substrate 12.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

For example, alternative embodiments can be formed without the ribs 33 on the housing 14. Moreover, pin-type contacts can be used in lieu of the contacts 18a, 18b in alternative embodiments.

More or less than four of the wafers 50 can be used in alternative embodiments, and the wafers 50 can be positioned at locations on the lower surface 36 of the housing 14 other than the outer corners. The wafers 50 can be formed in shapes other than square in alternative embodiments.

Alternative embodiments can configured without pockets, such as the pockets 42, for accommodating the solder balls 60 (the wafers 50 used with this particular embodiment likewise can be formed without the pockets 52.) The principles of the invention also can be applied to right angle connectors, and to connectors that incorporate insert molded lead assemblies (IMLAs).

FIGS. 10–13 depict another alternative embodiment in the form of an electrical connector 100. Components of the connector 100 that are substantially identical to those of the connector 10 are denoted with identical reference numerals in the text and figures.

The connector 100 comprises a housing 102. The housing 102 includes a bottom portion 104 having a lower surface 106. The lower surface 106 has a plurality of pockets 110 formed therein. The pockets 110 are located proximate the outer corners of the lower surface 106 (see FIGS. 10 and 11). The connector 100 does not include the wafers 50 or the depressions 38 of the connector 10.

Figure 10:
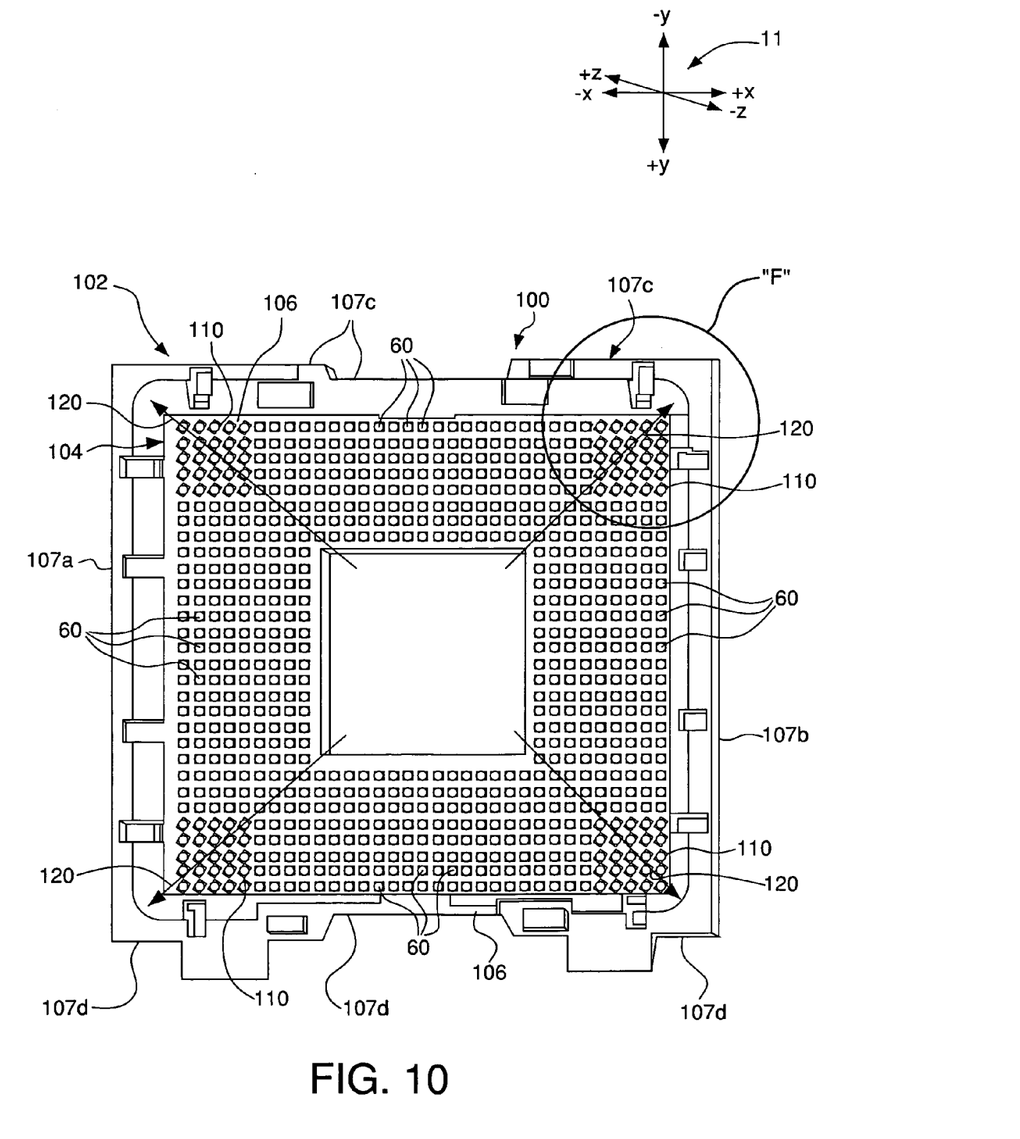
FIG. 10 is a bottom view of an alternative embodiment of the electrical connector shown FIGS. 1–9.

The housing 102 has a first side 107a and an opposing second side 107b (see FIG. 10). The housing 102 also has a third side 107c and an opposing fourth side 107d. The third and fourth sides 107c, 107d each adjoin the first and second sides 107a, 107b. The first and second sides 107a, 107b each extend substantially in the "y" direction. The third and fourth sides 107c, 107d each extend substantially in the "x" direction.

Twenty-five of the pockets 110, arranged in a five-by-five array, are formed at each corner of the lower surface 106. The optimal number and arrangement of the pockets 110 is application dependent. A specific number and arrangement of the pockets 110 is specified for exemplary purposes only.

The connector 100 includes a plurality of the contacts 18a, 18b as described above in relation to the connector 10. The contacts 18a, 18b can be mounted in cavities 37 formed in the housing 102 by a plurality of ribs 33 and partitions 35, as described above in relation to the connector 10. The pockets 110 each receive the tail 24 of a corresponding one of the contacts 18b (see FIG. 13; the ribs 33 and partitions 35 are not depicted in FIG. 13, for clarity).

A plurality of the penetrations 40 and the pockets 42 can be formed in the bottom portion 104 of the housing 102 to accommodate the tails 24 of each contact 18b, as described above in relation to the connector 10. (Alternative embodiments can be formed without the pockets 40). The tail 24 of each contact 18a can be attached to a solder ball 60 positioned, in part, within the associated pocket 40.

Figure 13:
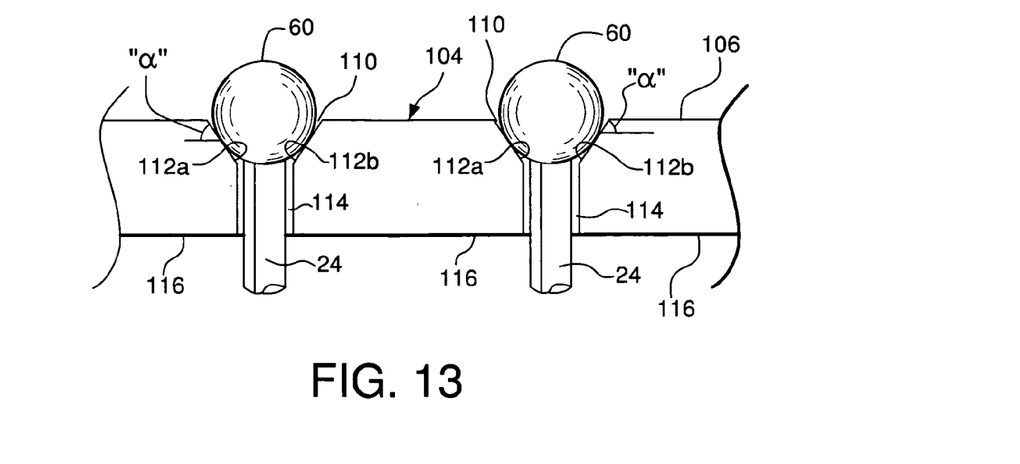
FIG. 13 is a cross-sectional view taken through the line "H—H" of FIG. 12.

A plurality of penetrations 114 are formed in the bottom portion 106 (see FIG. 13). Each penetration 114 extends between the upper surface 116, and a corresponding one of the pockets 110.

The tail 24 of each contact 18b extends through a corresponding penetration 114 and into the pocket 110, and is attached to a solder ball 60 positioned, in part, within the pocket 110. The penetrations 114 preferably are sized so that a clearance exists between the sides of the penetration 114 and the associated tail 24 (see FIG. 13).

The solder balls 60 can be subject to a reflow process to form solder connections 64 between the contacts 18b and corresponding contact pads 52 on the substrate 12, as described above in relation to the connector 10.

Figure 12:
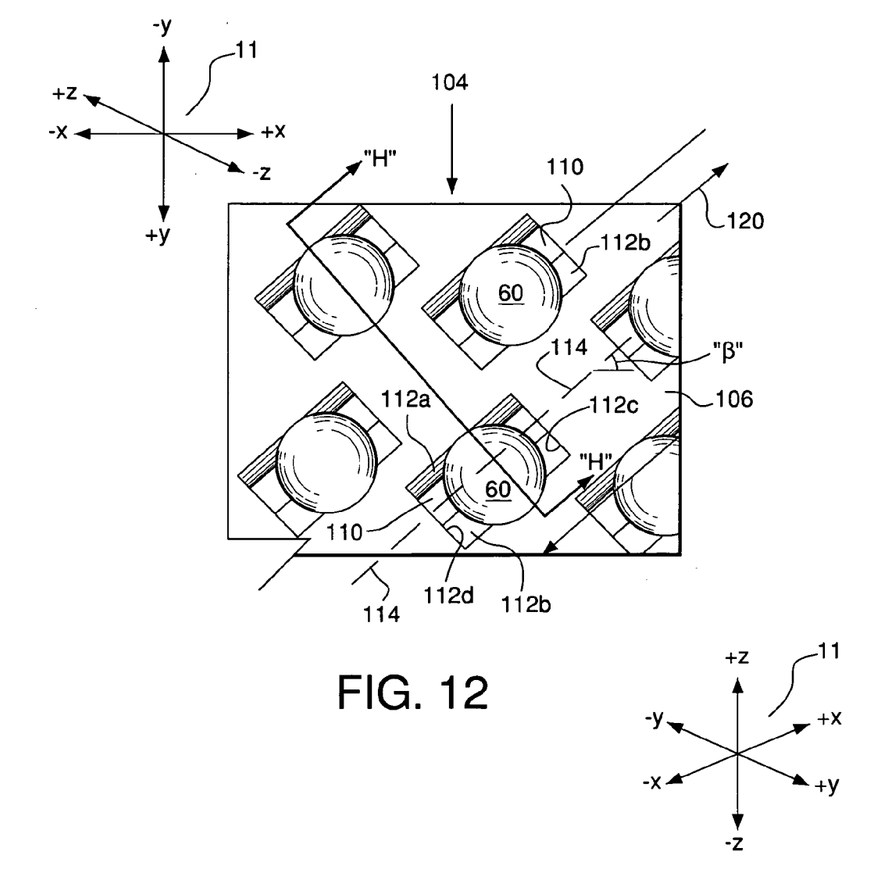
FIG. 12 is a magnified view of the area designated "G" in FIG. 11.

The pockets 110 are each defined, in part, by a first surface 112a and an opposing, substantially parallel second surface 112b (see FIG. 12). Each pocket 110 is further defined by a third surface 112c and an opposing, substantially parallel fourth surface 112d. The third and fourth surfaces 112c, 112d each adjoin the first and second surfaces 112a, 112b. The first, second, third, and fourth surfaces 112a, 112b, 112c, 112d each extend inward, into the bottom portion 104, from the lower surface 106.

The third and fourth surfaces 112c, 112d are oriented in a substantially vertical (z-axis) direction (from the perspective of FIG. 13). The first and second surfaces 112a, 112b preferably are angled in relation to the vertical direction (the angle between the first and second surfaces 112a, 112b and the vertical direction is denoted by the reference symbol "α" in FIG. 13). Preferably the angle α is approximately forty to approximately forty-five degrees. It should be noted that the optimal value for the angle α is application dependent; a specific value is specified herein for exemplary purposes only.

Figure 11:
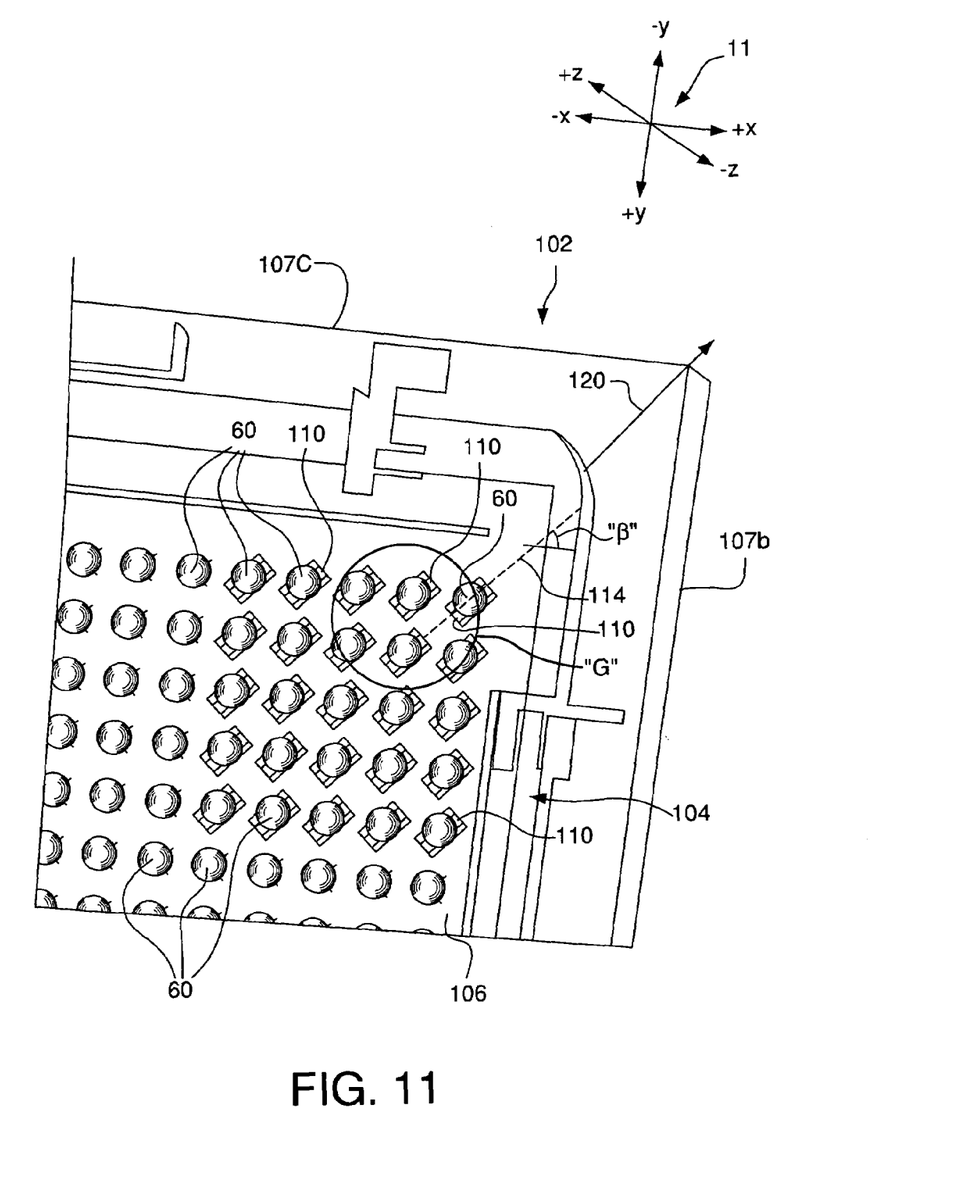
FIG. 11 is a magnified view of the area designated "F" in FIG. 10.

The first and second surfaces 112a, 112b are elongated, i.e., the first and second surfaces 112a, 112b are longer than the third and fourth surfaces 112c, 112d (see FIGS. 11 and 12).

Each pocket 110 has a longitudinal axis 114 extending in a direction substantially parallel to the first and second surfaces 112a, 112b (see FIG. 12). The longitudinal axis 114 is angled in relation to the "x" and "y" directions, as denoted in the figures. The angle between the axis 114 and the "x" direction is denoted by the reference symbol "β" in FIG. 12. (The third and fourth sides 107c, 107d each extend substantially in the "x" direction, as noted above. Hence, the angle β also represents the approximate angle between the axis 114 and the third and fourth sides 107c, 107d.)

Differences between the thermally-induced deflection of the substrate 12 and the housing 102 are believed to be maximal at or near the outer corners of the housing 102, as discussed above. The thermally-induced deflection is believed to cause the corners of the housing 102 to expand outward, in a substantially diagonal direction, in relation to the center of the lower surface 106. The direction of expansion of the corners of the housing 102 is denoted by the arrows 120 in FIGS. 10–12.

The orientation of the first and second surfaces 112a, 112b preferably is selected so that the longitudinal axis 114 extends in a direction substantially coincident with the arrows 120. In other words, the orientation of the longitudinal axis 114 substantially coincides with the direction in which the corners of the housing 102 expand in response to thermally-induced deflection of the housing 102 and the substrate 12.

For example, it is believed that the corners of the lower surface 106 expand in a direction offset from the "x" axis by approximately thirty-three degrees to approximately forty-eight degrees. Hence, the orientation of the first and second surfaces 112a, 112b associated with this corner preferably is selected so that the angle β is approximately thirty-three degrees to approximately forty-eight degrees. (The optimal value for angle β is application dependent. A specific value is presented for exemplary purposes only.)

Orienting the pockets 110 in a direction substantially coincident with the direction of thermal expansion of the bottom portion 104, it is believed, can help to reduce or substantially eliminate stresses on the solder connections 64 caused by differences between the thermally-induced deflection of the substrate 12 and the housing 102. In particular, the elongation and orientation of the pockets 110 is believed to permit the outer corners of the housing 102 to move in relation to the associated contacts 18b and solder connections 64. This movement can reduce or eliminate stresses in the solder connections 64 caused by thermal cycling of the connector 100 and the substrate 12.

What is claimed is:

1. An electrical connector capable of being mounted on a substrate, comprising:
    at least two wafers;
    a housing having at least two depressions formed therein proximate respective corners of the housing for receiving respective ones of the wafers, the wafers being movable in relation to the housing when the wafers are positioned in the depressions;
    a first plurality of contacts extending through the housing;
    a first plurality of fusible elements mounted on respective ends of the first plurality of contacts for securing the first plurality of contacts to the housing and the substrate so that each of the first plurality of contacts is fixed in relation to the housing when the electrical connector is mounted on the substrate; and
    a second plurality of contacts each extending through the housing and an associated one of the wafers;
    a second plurality of fusible elements mounted on respective ends of the second plurality of contacts for securing the second plurality of contacts to the wafers and the substrate so that a tail of each of the second plurality of contacts is fixed in relation to the associated wafer when the electrical connector is mounted on the substrate,
    wherein the second plurality of fusible elements can move with respect to the housing, a clearance exists between each of the wafers and a periphery of the associated depression; the second plurality of fusible elements are mounted on an end of the second plurality of contacts so that one side of each of the wafers faces the second plurality of fusible elements and an opposite side of each of the wafers faces the housing, and the first plurality of contacts extends through the housing only.

2. The connector of claim 1, wherein the first plurality of fusible elements and the second plurality of fusible elements form a ball-grid array.

3. The connector of claim 1, wherein each of the wafers is substantially square.

4. The connector of claim 1, wherein each of the wafers slidably engages the housing.

5. The connector of claim 1, wherein the second plurality of contacts are movable in relation to the housing and the first plurality of contacts.

6. The connector of clam 1, wherein a depth of the depressions is approximately equal to a thickness of the wafers.

7. The connector of claim 1, wherein the housing has a plurality of pockets formed therein for receiving respective ones of the first plurality of fusible elements, each of the pockets adjoining a respective one of the penetrations associated with the first plurality of contacts.

8. The connector of claim 1, wherein the fusible element is a solder ball.

9. The connector of claim 1, wherein the clearance is approximately equal to a maximum anticipated difference between thermally-induced deflection of the housing and the substrate proximate the second plurality of contacts.

10. The connector of claim 1, wherein the connector is a socket for a ball-grid array connector.

11. The connector of claim 1, wherein each of the wafers has a plurality of slots formed therein and the second plurality of contacts each extend through a respective one of the slots.

12. The connector of claim 11, wherein the second plurality of contacts fit within the respective slots with no substantial clearance between the second plurality of contacts and a periphery of the respective slots.

13. The connector of claim 11, wherein each of the wafers has a plurality of pockets formed therein for receiving respective ones of the second plurality of fusible elements, and each of the pockets adjoins a respective one of the slots.

14. The connector of claim 1, wherein the housing has a plurality of penetrations formed therein and the first plurality of contacts and the second plurality of contacts each extend through a respective one of the penetrations.

15. The connector of claim 14, wherein a clearance exists between the first and second plurality of contacts and a periphery of the respective ones of the penetrations.

* * * * *